United States Patent
Jang et al.

(10) Patent No.: US 6,169,297 B1
(45) Date of Patent: Jan. 2, 2001

(54) METAL THIN FILM WITH OHMIC CONTACT FOR LIGHT EMIT DIODES

(75) Inventors: Ja Soon Jang; Hyo Keun Kim; Seong Ju Park; Tae Yeon Seong; Heung Kyu Jang, all of Kwangju (KR)

(73) Assignee: Kwangju Institute of Science and Technology, Kwangju (KR)

( * ) Notice: Under 35 U.S.C. 154(b), the term of this patent shall be extended for 0 days.

(21) Appl. No.: 09/213,735

(22) Filed: Dec. 17, 1998

(30) Foreign Application Priority Data

Dec. 23, 1997 (KR) .................................................. 97-72150

(51) Int. Cl.$^7$ ..................................................... H01L 33/00

(52) U.S. Cl. ............................ 257/99; 257/103; 257/745; 257/751

(58) Field of Search ................................. 257/79, 91, 99, 257/103, 744, 745, 751, 766, 767

(56) References Cited

U.S. PATENT DOCUMENTS 5,563,422  10/1996  Nakamura et al. ................... 257/751
6,008,539 * 12/1999  Shibata et al. ........................ 257/745

OTHER PUBLICATIONS

Cr/Ni/Au ohmic contacts to the moderately doped p–and n–GaN, Taek Kim, Myung C. Yoo, and Taeil Kim, Photonics Semiconductor Lab., Samsung Advanced Institute of Technology, P.O. Box 111, Suwon 440–600, Korea, taek @saitgw.sait.samsung. co.kr, 1997, Mat. Res. Soc. Symp. Proc. vol. 449.

Comparison of Ni/Au,Pd/Au, and Cr/Au Metallizations for Ohmic Contacts to p–GaN, J.T. Trexler, S.J. Pearton, P.H. Holloway, M.G. Mier, K.R. Evans, and R.F. Karlicek, Department of Materials Science and Engineering, University of Florida, Gainesville, FL 32611–6400. Solid State Electronics Directorate, Wright Laboratory, Wright–Patterson Air Force Base, OH 45433–7323, Emcore Corporation, Somerset, NJ 08873, 1997, Mat. Res. Soc. Symp. Proc. vol. 449.

* cited by examiner

*Primary Examiner*—Minh Loan Tran
(74) *Attorney, Agent, or Firm*—Greer, Burns & Crain, Ltd.

(57) ABSTRACT

A metal thin film with an ohmic contact for light emit diodes and a method of producing such a film are disclosed. The metal thin film has a p-type gallium nitride (GaN) semiconductor layer. Nickel (Ni), platinum (Pt) and gold (Au) layers are deposited on the GaN semiconductor layer in a way such that the gold layer forms a top layer, with either one of the platinum and nickel layers being selectively used as an inter-diffusion barrier between metal layers. The inter-diffusion barrier may be formed by depositing platinum between the nickel and gold layers, thus forming an Ni/Pt/Au metal thin film, or formed by depositing nickel between the platinum and gold layers, thus forming an Pt/Ni/Au metal thin film. In the method, a GaN semiconductor is washed so as to be free from carbide and oxide layers. The Ni, Pt and Au layers are formed on the GaN semiconductor layer through a vacuum deposition process at $5 \times 10^{-5}$–$2 \times 10^{-1}$ torr. The GaN semiconductor, having the metal thin film, is heat treated for 30 seconds–3 hours and at 250–1,000° C., and under nitrogen or argon ambient.

3 Claims, 3 Drawing Sheets

METAL THIN FILM WITH OHMIC CONTACT FOR LIGHT EMIT DIODES

BACKGROUND OF THE INVENTION

1. Field of the Invention

The present invention relates, in general, to a metal thin film with an ohmic contact for light emit diodes and a method of producing such a film and, more particularly, to an improvement in a formation of ohmic contact in such a metal thin film during a process of producing blue light emit diodes using p-type gallium nitride (GaN)-based compound semiconductors, the improvement being for a formation of an ohmic contact having excellent thermal and electrical properties.

2. Description of the Prior Art

As well known to those skilled in the art, in order to produce optical devices, such as light emit diodes or laser diodes, it is primarily necessary to provide conditions for a formation of optimal ohmic contact at the junction between a semiconductor layer and a metal layer. Such conditions for the formation of optimal ohmic contact include smooth surface morphology, good thermal stability, simple processibility, low contact resistance, high production yield, good corrosion resistance, and good adhesion to III–V Group compound semiconductors.

One of the important factors, required to accomplish the above-mentioned conditions for a formation of optimal ohmic contact, is a diffusion barrier provided in a metal thin film deposited on a semiconductor layer. Such a diffusion barrier reduces a relative action between a metal capping layer and the semiconductor layer, thus providing a smooth surface morphology and improving the thermal stability of the resulting metal thin film. This effectively reduces a decomposition of the ohmic contact. Such a smooth surface morphology also improves the production yield of optical devices. An ohmic contact, having a low contact resistance, improves the operational efficiency of the resulting optical devices.

A prior art technique for a formation of such an ohmic contact in a metal thin film for optical devices may be referred to in U.S. Pat. No. 5,563,422, entitled "Gallium Nitride-Based III–V Group Compound Semiconductor Device and Method of Producing the Same". In the above U.S. patent, an electrode, covered with a metal thin film, is used in place of a transparent electrode since some problems occur in an n-type ohmic contact due to nonconductive characteristics of a transparent substrate or a sapphire substrate. However, the technique, disclosed in the above U.S patent, is problematic in that the electrode, covered with the metal thin film, fails to allow light to effectively pass through. In Material Research Society Symposium Proceeding 449, 1061, 1997, T. Kim and et al. reported that a required specific contact resistance Rc for an optimal ohmic contact, formed in an Ni/Cr/Au model through a heat treatment process for 30 minutes and at 500° C., is $8.3 \times 10^{-2}$ $\Omega cm^{-2}$. In the same Proceeding 449, 1093, 1197, J. T. Trexler and et al. reported that a required specific contact resistance for an optimal ohmic contact, formed in a Cr/Au model through a heat treatment process for 15 minutes and at 900° C., is $4.3 \times 10^{-1}$ $\Omega cm^{-2}$.

In the prior art, there were a plurality of reference documents disclosing a formation of Ni or Pt ohmic contact in a metal thin film for optical devices. However, it is almost impossible to refer to prior art documents disclosing a formation of p-type gallium nitride (GaN) ohmic contact in a metal thin film.

Such a defective ohmic contact, formed in a metal thin film, causes serious problems in a continuous wave mode of gallium nitride light emit diodes (GaN LEDs) and laser diodes (LDs). In an effort to overcome the above-mentioned problems, the inventors of this invention have actively studied a formation of ohmic contact in a metal thin film by interposing a Pt layer between Ni and Au layers or an Ni layer between Pt and Au layers different from a typical formation of P-type ohmic contact in Ni/Au or Ni/Cr/Au models, thus forming an Ni/Pt/Au or Pt/Ni/Au thin film having good thermal, electrical and mechanical properties.

SUMMARY OF THE INVENTION

Accordingly, the present invention has been made keeping in mind the above problems occurring in the prior art. An object of the present invention is to provide an ohmic contact metal system, which is formed through a vapor deposition of a metal, such as nickel (Ni) or platinum (Pt) acting as an inter-diffusion barrier in a metal thin film, on a p-type gallium nitride (GaN) semiconductor layer different from typical Ni/Au or Pt/Au models, thus having good thermal, electrical and structural properties.

Another object of the present invention is to provide a new method of producing a metal thin film for LEDs, which forms such a metal thin film on a p-type GaN semiconductor layer through a vapor deposition.

A further object of the present invention is to provide an ohmic contact, which is formed in a metal thin film deposited on a p-type GaN semiconductor layer through either a vapor deposition of a platinum inter-diffusion barrier between nickel and gold layers or a vapor deposition of a nickel inter-diffusion barrier between platinum and gold layers different from typical Ni/Au or Pt/Au models.

Primarily, in order to form a P-type ohmic contact of the present invention, it is necessary to set the doping concentration of the P-type GaN semiconductor to be not lower than $10^{18}$ $cm^{-3}$. The quality of the ohmic contact, formed in a metal thin film, is mainly influenced by the doping concentration of the GaN semiconductor and is classified into three types. That is, when the doping concentration of the GaN semiconductor is lower than $10^{17}$ $cm^{-3}$, the ohmic contact results in a thermionic emission. When the doping concentration of the GaN semiconductor Is ranged from $10^{17}$ $cm^{-3}$ to $10^{18}$ $cm^{-3}$, the ohmic contact results in a thermionic field emission. On the other hand, when the doping concentration of the GaN semiconductor is higher than $10^{18}$ $cm^{-3}$, the ohmic contact results in a field emission. When the doping concentration of the GaN semiconductor is increased, there is a flow of carriers in the metal thin film due to a tunneling effect regardless of a metal semiconductor contact barrier. An ohmic contact is thus naturally formed in the metal thin film for optical devices.

Secondarily, such a formation of P-type ohmic contact in a metal thin film requires use of a diffusion barrier, having an excellent thermal property. Such a diffusion barrier is an important factor for a formation of ohmic contact. The diffusion barrier is preferably made of a metal, such as nickel, platinum, or chrome. In a typical method of forcing a P-type ohmic contact, magnesium, used as a p-type dopant, forms an Mg—H compound during the growth of gallium nitride (GaN), thus causing a serious problem during the process of forming a GaN semiconductor layer having a high doping concentration. In such a case, the resulting GaN layer regrettably has a low doping concentration of about $10^{17}$ $cm^{-3}$. It is thus almost impossible to form a desired ohmic contact in the metal thin film due to such a low doping concentration.

A metal thin film with a nickel (Ni) ohmic contact may be formed as several models, such as Ni/Au, Ni/Cr/Au and Ni/Ni/Au films, even when the semiconductor layer has a low doping concentration. However, such models have a high specific contact resistance ranged from about $1 \times 10^{-2}$ ohm-cm$^2$ to about $8 \times 10^{-2}$ ohm-cm$^2$. In addition, the thermal property of such models is regrettably reduced due to a diffusion of nickel, thus forming a poor surface morphology of a resulting metal thin film and deteriorating the production yield of the optical devices using the metal thin film.

However, the method of this invention produces a metal thin film for optical devices using both nickel as a diffusion barrier and platinum as an inter-diffusion barrier between nickel and gold. The metal thin film of this invention thus has a desired ohmic contact having a good thermal property and a smooth surface morphology. The specific contact resistance of the metal thin film according to this invention is $10^{-2}$–$10^{-3}$ ohm-cm$^2$, and so it is possible for a resulting metal thin film to have a desired specific contact resistance even when the metal thin film is deposited on a semiconductor layer having a low doping concentration. In a brief description, the metal thin film of this invention has a low contact resistance regardless of a low doping concentration of $9.4 \times 10^{16}$ cm$^{-3}$ and a high surface resistance of not lower than 1 MΩ/sq.

BRIEF DESCRIPTION OF THE DRAWINGS

The above objects, other objects, features, and other advantages of the present invention will be more clearly understood from the following detailed description taken in conjunction with the accompanying drawings, in which:

FIGS. 1a and 1b are cross-sectional views, showing the structure of metal thin films deposited on p-type gallium nitride (GaN) semiconductor layers in accordance with the preferred embodiments of the present invention, in which:

FIG. 1a shows the structure of an Ni/Pt/Au metal thin film deposited on a GaN semiconductor layer in accordance with the primary embodiment of this invention; and FIG. 1b shows the structure of a Pt/Ni/Au metal thin film deposited on a GaN semiconductor layer in accordance with the second embodiment of this invention;

FIGS. 2a and 2b are graphs, showing current-voltage characteristics of different ohmic contacts formed in Ni/Pt/Au metal thin films in accordance with different modifications of the primary embodiment of this invention, in which:

FIG. 2a is a graph of an ohmic contact formed through a heat treatment process for 30 seconds and at 500° C.; and FIG. 2b is a graph of an ohmic contact formed through a heat treatment process for 60 seconds and at 500° C.;

FIGS. 3a to 3c are views, showing the surface morphologies of Ni/Pt/Au metal thin films formed in accordance with different modifications of the primary embodiment of this invention, in which:

FIG. 3a shows the surface morphology of an Ni/Pt/Au thin film, heat-treated for 30 seconds at 500° C. in accordance with the first modification of the primary embodiment;

FIG. 3b shows the surface morphology of an Ni/Pt/Au thin film, heat-treated for 60 seconds at 500° C. in accordance with the second modification of the primary embodiment; and FIG. 3c shows the surface morphology of an Ni/Pt/Au thin film, heat-treated for 30 minutes at 500° C. in accordance with the third modification of the primary embodiment.

DESCRIPTION OF THE PREFERRED EMBODIMENTS

The thermal property of an Ni/PT/Au metal thin film for LEDs according to this invention and a formation of ohmic contact in the above metal thin film will be described in detail in conjunction with the accompanying drawings.

Figure 1A:
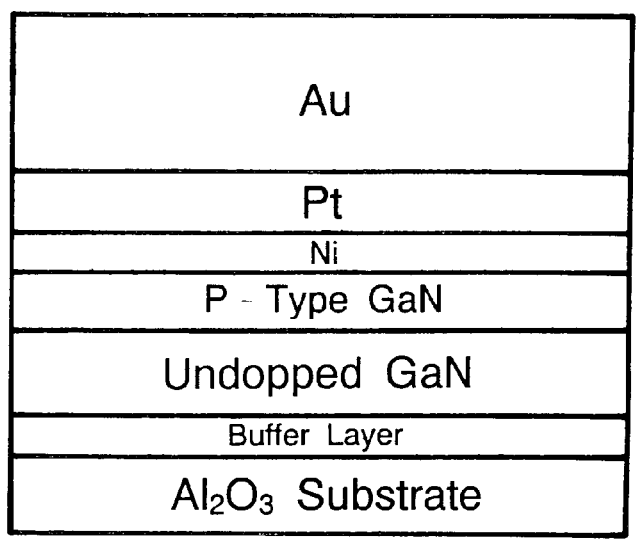
Figure 1B:
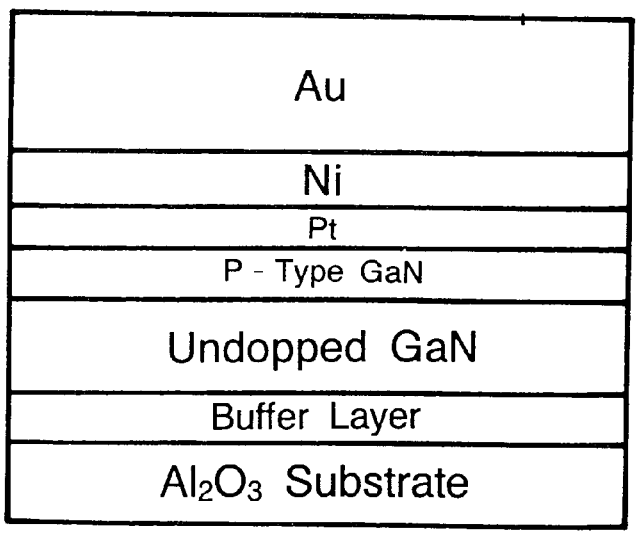

FIG. 1a shows the structure of an Ni/Pt/Au metal thin film formed on a GaN semiconductor layer in accordance with the primary embodiment of this invention. FIG. 1b shows the structure of a Pt/Ni/Au metal thin film formed on a GaN semiconductor layer in accordance with the second embodiment of this invention.

Figure 2A:
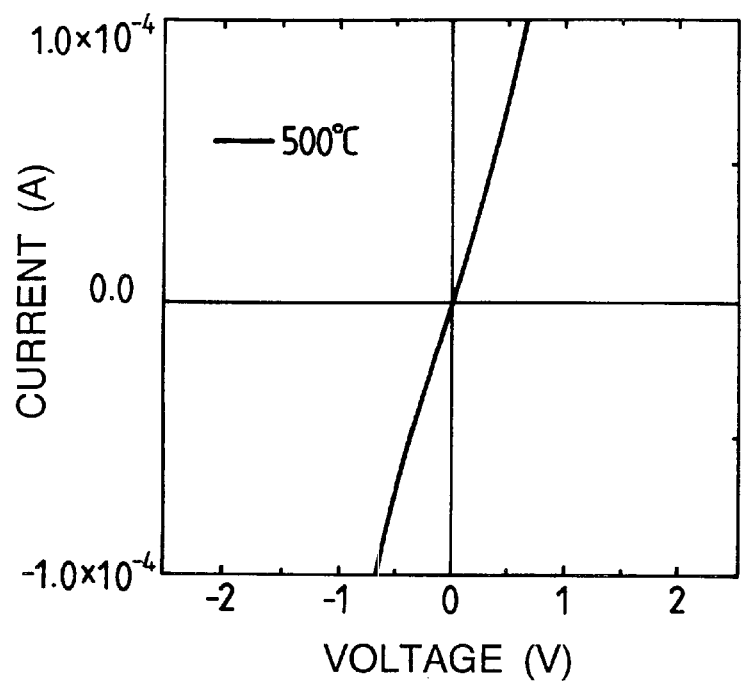
Figure 3A:
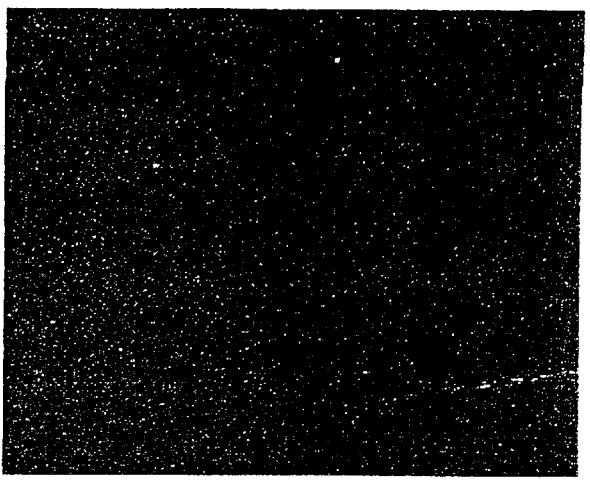

On the other hand, FIG. 2a is a graph, showing the current-voltage characteristics of an ohmic contact formed in an Ni/Pt/Au thin film in accordance with a first modification of the primary embodiment of this invention. The above ohmic contact is formed through a heat treatment process for 30 seconds at 500° C. The specific contact resistance of the above ohmic contact is $9.8 \times 10^{-3}$ ohm-cm$^2$. This graph shows that the metal thin film of this invention has such a low specific contact resistance regardless of a low doping concentration of the GaN semiconductor and a high surface resistance. The SEM surface morphology of the above metal thin film, which is observed by a scanning electron microscope (SEM), is very smooth as shown in FIG. 3a.

Figure 2B:
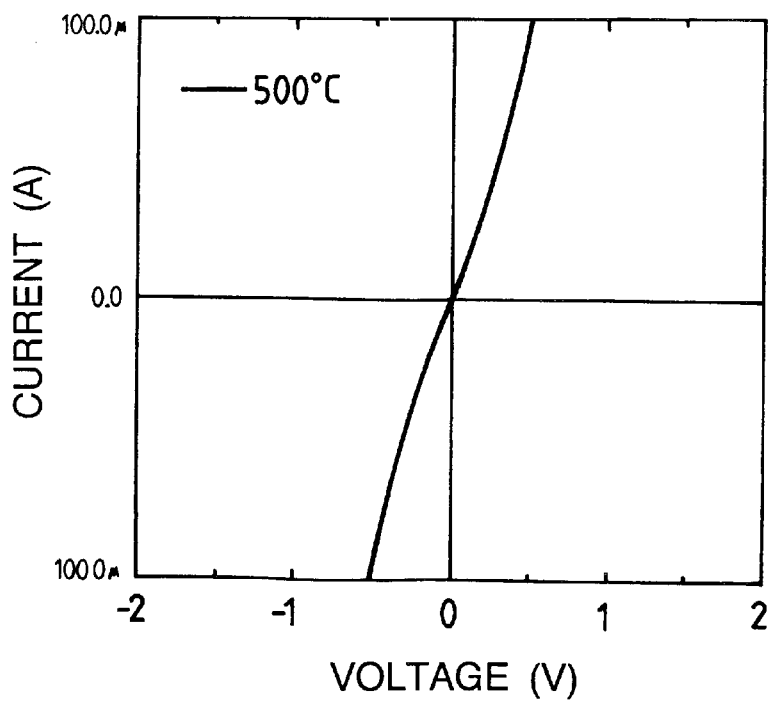
Figure 3B:
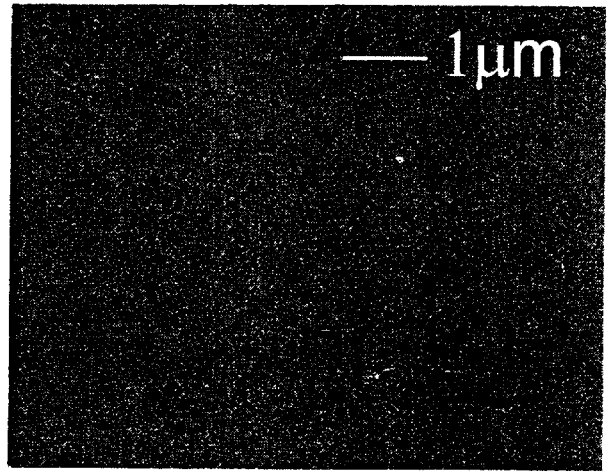
Figure 3C:
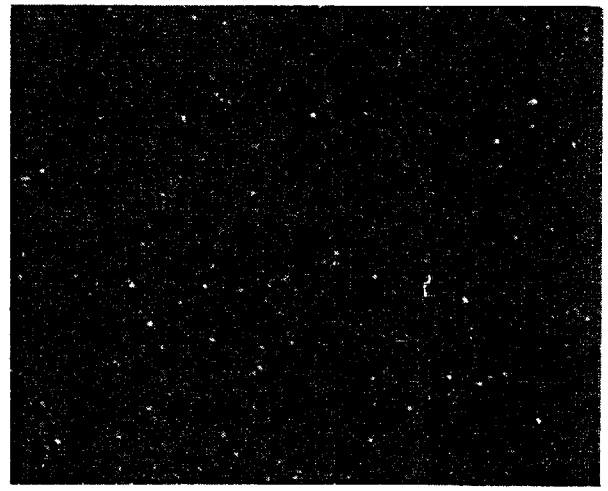

FIG. 2b is a graph, showing the current-voltage characteristics of an ohmic contact formed in an Ni/Pt/Au metal thin film in accordance with a second modification of the primary embodiment of this invention. The above ohmic contact is formed through a heat treatment process for 60 seconds at 500° C. The specific contact resistance of the above ohmic contact is $9.6 \times 10^{-2}$ ohm-cm$^2$. The SEM surface morphology of the above metal thin film, which is observed by a scanning electron microscope (SEM), is very smooth as shown in FIG. 3b.

FIG. 3d shows the SEM surface morphology of a metal thin film with an ohmic contact being formed through a heat treatment process for 30 minutes at 500° C. As shown in the drawing, the SEM surface morphology of the above metal thin film is very smooth.

In the present invention, the thicknesses of the metal layers of the Ni/Pt/Au film or the Pt/Ni/Au film are preferably set to Ni/Pt/Au:1–5,000 nm/1–5,000 nm/15,000 nm and Pt/Ni/Au:1–5,000 nm/10–1,000 nm/10–4,000 nm. In addition, a vacuum deposition process of forming such a metal thin film on the GaN semiconductor is preferably performed at $5 \times 10^{-5}$–$2 \times 10^{-7}$ torr. A heat treatment process for the metal thin film formed on the GaN semiconductor is preferably performed for 10 seconds–3 hours and at 250–1,000° C., and under nitrogen or argon ambient.

The present invention will be described in detail through the following examples which are set forth to illustrate, but are not to be construed as the limit of the present invention.

EXAMPLE 1 p-type gallium nitride (GaN) semiconductor was repeatedly washed in an ultrasonic bath using a plurality of washing liquids: trichloroethylene, acetone, methanol and distilled water, for 5 minutes and at 50° C. for each washing liquid. After the washing process, the p-type GaN semiconductor was dried for 10 minutes and at 100° C. through a hard baking process, thus being completely free from moisture. A photoresist was coated on the p-type GaN semiconductor through a spin coating process at 5,500 rpm.

Thereafter, the p-type GaN semiconductor was subjected to a soft baking process for 15 minutes and at 85° C. prior to being subjected to a mask pattern developing process. In order to develop a mask pattern on the GaN semiconductor, a mask was precisely arrayed on the GaN semiconductor prior to being primarily exposed to an ultraviolet ray for 60 seconds. After the primary exposure to the ultraviolet ray, the GaN semiconductor was subjected to a reverse baking process at 115° C. prior to being secondarily exposed to an ultraviolet ray for 30–100 seconds. The GaN semiconductor was, thereafter, subjected to a developing process for about 40 seconds in a solution which was prepared by mixing a developing agent with distilled water at a mixing ratio of 1:4.

Thereafter, the GaN semiconductor was immersed in an oxidation etchant solution (BOE) for 30 seconds, and so the carbide or oxide layer was removed from the surface of the GaN semiconductor. Thereafter, a vapor deposition process was performed to form a metal thin film on the GaN semiconductor. In the above vapor deposition process, nickel (Ni), platinum (Pt) and gold (Au) were orderly deposited on the GaN semiconductor to thicknesses of 200 Å, 300Å and 800 Å, respectively, using an electron-beam evaporator, thus forming an Ni/Pt/Au metal thin film. The metal thin film deposited on the GaN semiconductor was, thereafter, subjected to a lift-off process. The lift-off process was followed by a heat treatment process where the metal thin film was heated in a rapid thermal annealing (RTA) furnace for 30 seconds and at 500° C. and under nitrogen or argon ambient. Therefore, an Ni/Pt/Au metal thin film with an ohmic contact for LEDs was produced. The structure of the above Ni/Pt/Au metal thin film is shown in FIG. 1a. The current-voltage characteristics of the ohmic contact formed in the above Ni/Pt/Au metal thin film are shown in FIG. 2a. The SEM surface morphology of the above Ni/Pt/Au metal thin film is shown in FIG. 3a.

EXAMPLE 2

The procedure of example 1 was repeated while changing the order of deposited metal layers on the GaN semiconductor from Ni/Pt/Au to Pt/Ni/Au. A Pt/Ni/Au metal thin film with an ohmic contact was produced. The structure of the above Pt/Ni/Au metal thin film is shown in FIG. 1b.

EXAMPLE 3

The procedure of example 1 was repeated while changing the conditions of the heat treatment process, performed after the lift-off process, from 30 seconds and 500° C. to 60 seconds and 500° C. An Ni/Pt/Au metal thin film with an ohmic contact was produced. The current-voltage characteristics of the ohmic contact formed in the above Ni/Pt/Au metal thin film are shown in FIG. 2b. The SEM surface morphology of the above Ni/Pt/Au metal thin film is shown in FIG. 3b.

EXAMPLE 4

The procedure of example 1 was repeated while changing the conditions of the heat treatment process, performed after the lift-off process, from 30 seconds and 500° C. to 30 minutes and 500° C. An Ni/Pt/Au metal thin film with an ohmic contact was produced. The SEM surface morphology of the above Ni/Pt/Au metal thin film is shown in FIG. 3d.

As described above, the present invention provides a metal thin film with an ohmic contact for LEDs and a method of producing such a metal thin film. In accordance with the present invention, the metal thin film with the ohmic contact has a smooth surface morphology. Such a smooth surface morphology allows the wire bonding effect during a process of packaging the metal thin film into an optical device to be improved, thus improving the production yield of such optical devices.

The smooth surface morphology of the metal thin film of this invention also is effectively maintained even when the thin film is subjected to a heat treatment process for a lengthy period of time. In addition, the metal thin film has a good thermal property capable of maintaining good ohmic characteristics, and a good electrical property, such as a low specific contact resistance and good current-voltage characteristics, thus reducing any electrical loss and thereby improving the optical effect of resulting optical devices. Therefore, the metal thin film of this invention effectively improves the electrical and optical efficiencies of resulting optical devices, and so the metal thin film of this invention does not cause any serious problem in a continuous wave mode of gallium nitride light emit diodes (GaN LEDs) and laser diodes (LDs). The present invention thus allows the quality of LEDs and LDs to be improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A metal thin film with an ohmic contact for light emit diodes, comprising:
    a p-type gallium nitride (GaN) semiconductor layer;
    a nickel (Ni) layer deposited on said p-type gallium nitride (GaN) semiconductor layer;
    a platinum (Pt) layer deposited on said nickel (Ni) layer; and
    a gold (Au) layer deposited on said platinum (Pt) layer, thus forming an Ni/Pt/Au metal thin film;
    said platinum (Pt) layer being used as an interdiffusion barrier between said gold layer and said nickel layer.

2. A metal thin film with an ohmic contact for light emit diodes, comprising:
    a p-type gallium nitride (GaN) semiconductor layer;
    a platinum (Pt) layer deposited on said p-type gallium nitride (GaN) semiconductor layer;
    a nickel (Ni) layer deposited on said platinum (Pt) layer; and
    a gold (Au) layer deposited on said nickel (Ni) layer, thus forming an Pt/Ni/Au metal thin film;
    said nickel (Ni) layer being used as an interdiffusion barrier between said gold and said platinum layer.

3. The metal thin film according to claim 2, wherein the nickel, platinum and gold layers of the Ni/Pt/Au metal thin film respectively have thicknesses of 1–5,000 nm, 1–5,000 nm, and 1–5,000 nm, while the platinum, nickel and gold layers of the Pt/Ni/Au metal thin film respectively have thicknesses of 1–5,000 nm, 10–1,000 nm, and 10–4,000 nm.

* * * * *